United States Patent
Heo et al.

(10) Patent No.: US 7,447,084 B2
(45) Date of Patent: Nov. 4, 2008

(54) SEMICONDUCTOR MEMORY DEVICE AND METHOD OF SUPPLYING WORDLINE VOLTAGE THEREOF

(75) Inventors: Nak-Won Heo, Suwon-si (KR); Kye-Hyun Kyung, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 130 days.

(21) Appl. No.: 11/325,102

(22) Filed: Jan. 4, 2006

(65) Prior Publication Data

US 2006/0146616 A1 Jul. 6, 2006

(30) Foreign Application Priority Data

Jan. 4, 2005 (KR) .................. 10-2005-0000562

(51) Int. Cl.
*G11C 5/14* (2006.01)
(52) U.S. Cl. ................. 365/189.09; 365/189.11; 365/230.06
(58) Field of Classification Search ............ 365/189.09, 365/222, 230.06, 149, 189.11
See application file for complete search history.

(56) References Cited

U.S. PATENT DOCUMENTS

| | | | | |
|---|---|---|---|---|
| 5,905,685 A | * | 5/1999 | Nakamura et al. | 365/207 |
| 6,343,044 B1 | * | 1/2002 | Hsu et al. | 365/227 |
| 6,377,508 B1 | * | 4/2002 | Tomishima et al. | 365/230.06 |
| 6,809,953 B2 | * | 10/2004 | Toyoda et al. | 365/145 |
| 7,009,904 B2 | * | 3/2006 | Kim | 365/211 |
| 2003/0103403 A1 | | 6/2003 | Tsujino | 365/222 |

FOREIGN PATENT DOCUMENTS

KR 1999-013050 2/1999

OTHER PUBLICATIONS

Minchen Chang, et al. "Impact of Gate-Induced Drain Leakage on Retention Time Distribution of 256 Mbit Dram with Negative Wordline Bias" pp. 1036-1041, IEEE Transactions on Electron Devices. vol. 50, No. 4, Apr. 2003.

* cited by examiner

*Primary Examiner*—Gene N. Auduong
(74) *Attorney, Agent, or Firm*—F. Chau & Associates, LLC

(57) ABSTRACT

A semiconductor memory device that includes a memory cell connected to a wordline and a wordline voltage generator. The wordline voltage generator supplies a first negative voltage to the wordline in a standby state and supplies a second negative voltage that is lower with respect to ground than the first negative voltage to the wordline in a refresh operation. Accordingly, a leakage current generated at a transistor of a memory cell by gate-induced drain leakage (GIDL) is suppressed to enhance the performance of a refresh operation.

12 Claims, 3 Drawing Sheets

SEMICONDUCTOR MEMORY DEVICE AND METHOD OF SUPPLYING WORDLINE VOLTAGE THEREOF

CROSS-REFERENCE TO RELATED APPLICATIONS

This application claims priority to Korean Patent Application No. 2005-00562, filed on Jan. 4, 2005, the disclosure of which is herein incorporated by reference in its entirety.

BACKGROUND OF THE INVENTION

1. Field of the Invention

The present invention relates to a semiconductor memory device and a method of supplying a wordline voltage thereof. More particularly, the present invention relates to a semiconductor memory device that includes a wordline voltage generator for supplying a negative wordline voltage and a method of supplying a wordline voltage thereof.

2. Description of Related Art

Semiconductor memory devices are classified into read-only memories (ROMs) and read-and-write memories also called random access memories (RAMs). RAMs are volatile memory devices that lose their contents when the power to them is turned off or interrupted temporarily, while ROMs are non-volatile memory devices in that their contents are not lost when power is removed. There are two basic types of RAM, dynamic RAM (DRAM) and static RAM (SRAM). The different types of ROM include programmable ROM (PROM), erasable PROM (EPROM), electrically EPROM (EEPROM), and flash memory.

In general, each cell of a DRAM includes one capacitor and one MOS transistor. A capacitor is charged when the data is stored in the DRAM cell in the write cycle. As is well known in the art, the capacitor is subject to charge leakage so that the data stored will be lost, unless the charge is refreshed periodically. Therefore, DRAM cells need a so-called "refresh operation" to preserve the data stored. When a semiconductor device operates in a standby or low-power mode, addresses are internally generated to continuously perform a refresh operation for wordlines before a refresh exit command is input. Such a refresh operation is called a self refresh operation.

The need to refresh memory cells can be reduced by decreasing current leakage. One prior art method employs increasing the threshold voltage of the access transistor to suppress current leakage through the transistor. However, with the general trend toward higher integration density and higher speed performance, the voltage level in a semiconductor memory device has an effect on device reliability. For example, the reduced memory cell size results in cell geometries that render the cells subject to damage as higher voltages are applied. In a negative wordline scheme, instead of increasing the threshold voltage of the transistor (and leaving the applied wordline voltage the same), the magnitude of the gate-to-source voltage that is applied to turn off the transistor is increased and the threshold voltage remains unchanged.

FIG. 1 illustrates a DRAM cell employing a negative wordline scheme. Referring to FIG. 1, a negative wordline voltage $V_{WL}$ is applied to the NMOS transistor. The negative wordline voltage is supplied from a wordline voltage generator (not shown).

A conventional wordline voltage generator generates a negative voltage VBB1 that is lower than a ground voltage in response to a standby signal STBY. When a wordline is deactivated, the negative voltage VBB1 is supplied to the wordline to maintain the wordline at a logic low level. Referring to FIG. 1, a wordline voltage $V_{WL}$ is maintained at a voltage level that is half of a negative voltage VBB supplied to a transistor bulk. For example, if a voltage VP applied to a capacitor is 0.8V and a negative voltage VBB applied to a bulk of an NMOS transistor is −0.8V, a negative voltage VBB1 of about −0.4V is applied to a wordline.

However, when a wordline goes to a logic low negative-voltage level, a leakage current $I_{leak}$ is generated at an NMOS transistor of;a memory cell by gate-induced drain leakage (GIDL). Due to the leakage current $I_{leak}$, stored data can be lost and refresh performance deteriorates over time.

SUMMARY OF THE INVENTION

Exemplary embodiments of the present invention are directed to a semiconductor memory device and a method of supplying a wordline voltage.

In an exemplary embodiment of the present invention, the semiconductor memory device includes a memory cell connected to a wordline and a wordline voltage generator. The wordline voltage generator supplies a first negative voltage to the wordline in a standby state and supplies a second negative voltage that is lower with respect to ground than the first negative voltage to the wordline in a refresh operation.

In an exemplary embodiment of the present invention, the refresh operation is a self-refresh operation.

In exemplary embodiments of the present invention, the wordline voltage generator includes a wordline driver and a negative voltage generator. The wordline voltage generator supplies the first or second negative voltage to the wordline when the wordline is deactivated. The negative voltage generator generates the first negative voltage in response to a standby signal and the second negative voltage in response to a refresh signal.

In an exemplary embodiment of the present invention, the wordline driver includes a PMOS transistor and an NMOS transistor. The PMOS transistor supplies a voltage that is higher than a power supply voltage to the wordline when the wordline is activated. The NMOS transistor supplies the first or second negative voltage to the wordline when the wordline is deactivated.

In an exemplary embodiment of the present invention, the negative voltage generator includes a level detector for detecting a first voltage level for generating the first negative voltage in response to the standby signal and for detecting a second voltage level for generating the second negative voltage in response to the refresh signal.

In an exemplary embodiment of the present invention, the memory cell includes one MOS transistor and one capacitor.

In an exemplary embodiment of the present invention, a method of supplying a wordline voltage includes supplying a first negative voltage to a wordline in response to a standby signal in a standby state, and supplying a second negative voltage that is lower with respect to ground than the first negative voltage to the wordline in response to a refresh signal when a semiconductor memory device enters a refresh state from the standby state.

In an exemplary embodiment of the present invention, the refresh signal is a self-refresh signal.

In an exemplary embodiment of the present invention, supplying a first negative voltage includes detecting a first voltage level in response to the standby signal and amplifying the first voltage level to generate the first negative voltage.

In an exemplary embodiment of the present invention, supplying a second negative voltage includes detecting a second voltage level in response to the refresh signal and amplifying the second voltage level to generate the second negative voltage.

BRIEF DESCRIPTION OF THE DRAWINGS

The present invention will become more apparent to those of ordinary skill in the art when descriptions of exemplary embodiments thereof are read with reference to the accompanying drawings, of which.

DETAILED DESCRIPTION OF THE EXEMPLARY EMBODIMENTS

Hereinafter, exemplary embodiments of the present invention will be described in detail with reference to the accompanying drawings.

Figure 1:
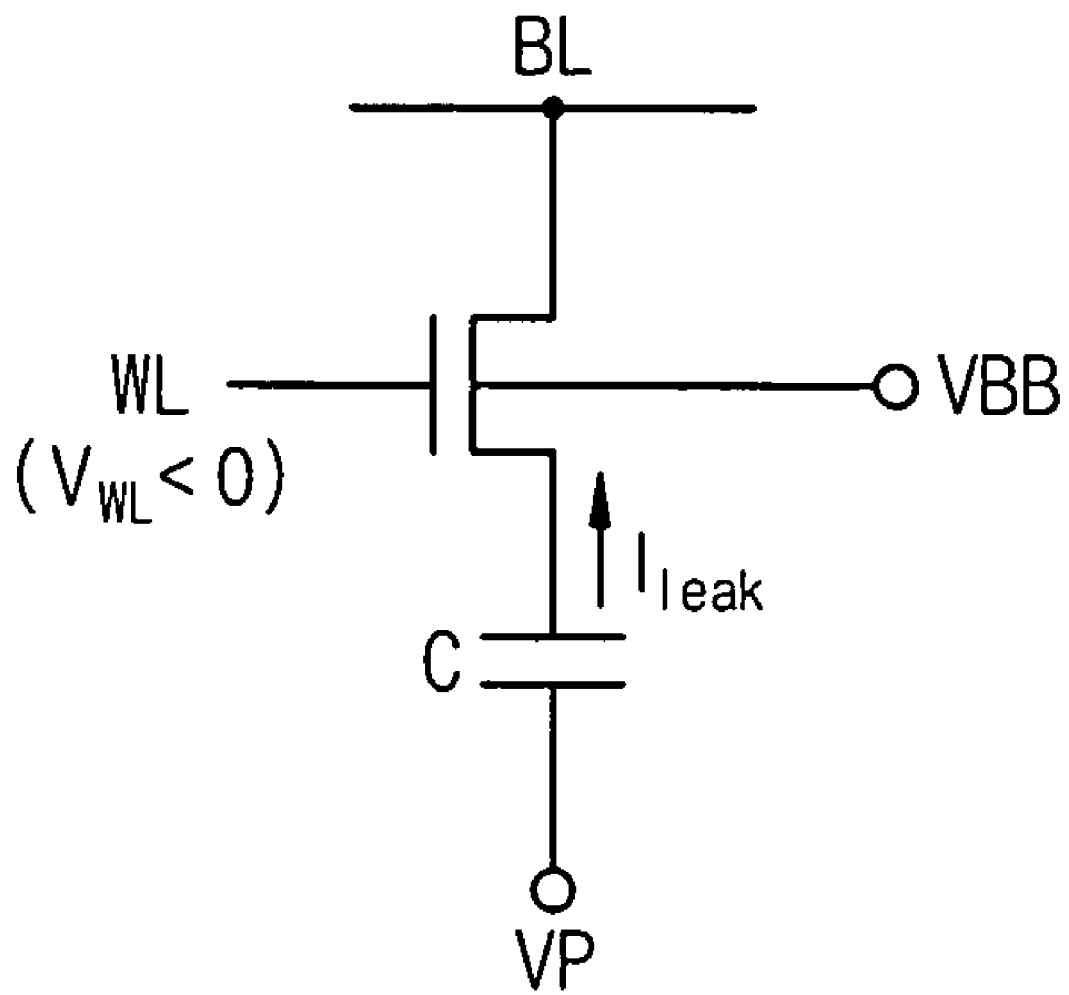
FIG. 1 illustrates a conventional DRAM cell.
Figure 2:
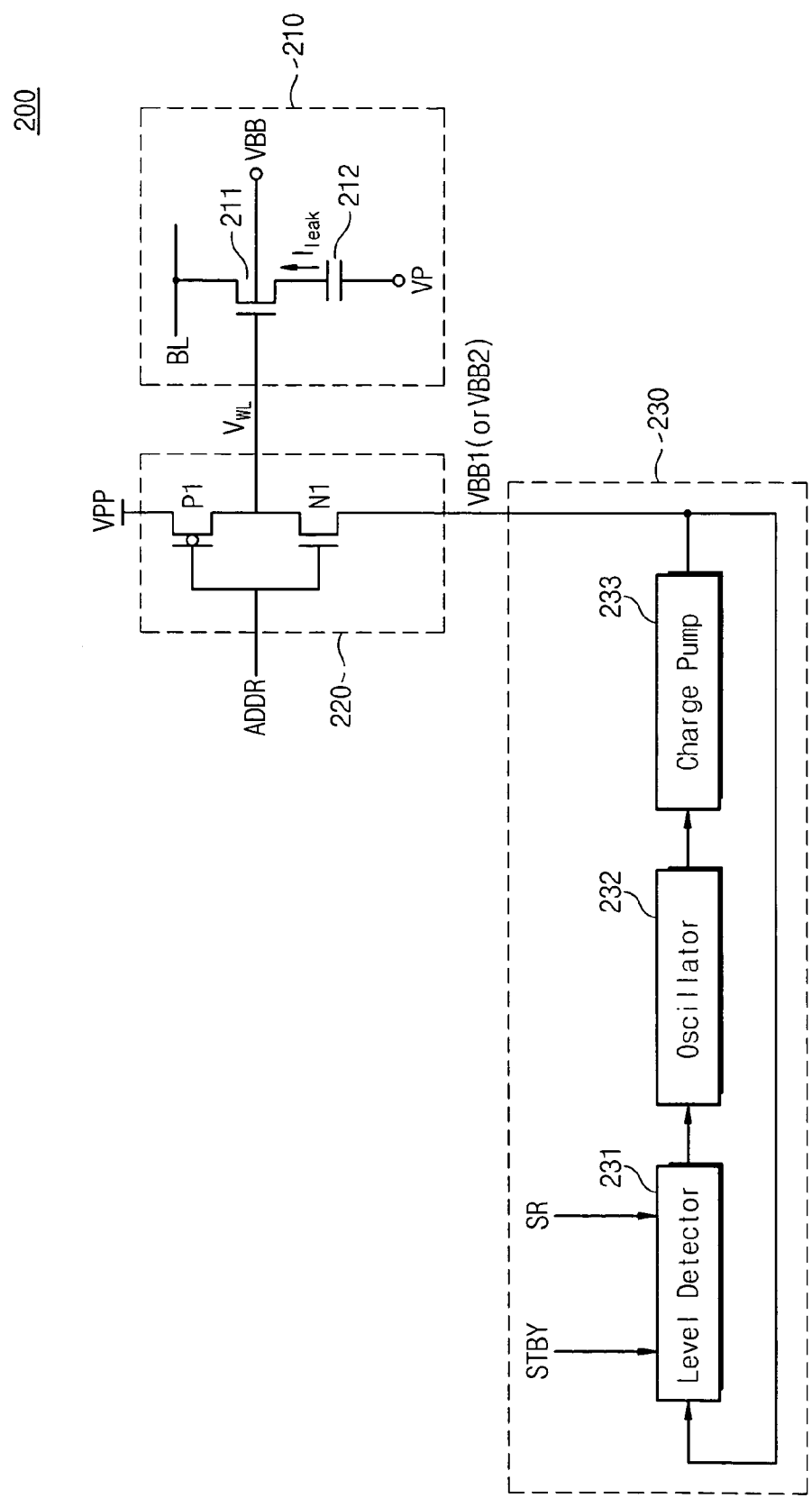
FIG. 2 is a block diagram of a semiconductor memory device according to an exemplary embodiment of the present invention.

A semiconductor memory device 200 according to an exemplary embodiment of the present invention is illustrated in FIG. 2. The semiconductor memory device 200 includes a memory cell 210, a wordline driver 220, and a negative voltage generator 230.

The memory cell 210 is a DRAM cell having one NMOS transistor 211 and one capacitor 212. The NMOS transistor 211 includes a gate for receiving a wordline voltage $V_{WL}$, a source connected to a bitline BL, and a drain connected to the capacitor 212. A negative wordline voltage $V_{WL}$ is supplied to the gate of the NMOS transistor 212 to enhance the characteristics of a refresh operation.

A wordline voltage $V_{WL}$ is supplied to the wordline driver 220. The wordline driver 220 includes one PMOS transistor P1 and one NMOS transistor N1. At an active operation, a voltage VPP that is higher than a power supply voltage VCC is supplied to a wordline when an address ADDR of the wordline is activated. At a precharge operation, a negative voltage (i.e., a minus voltage with respect to ground) is supplied to a wordline through the NMOS transistor N1 when an address ADDR of the wordline is deactivated. When a wordline is deactivated, the negative voltage is supplied to a wordline and the NMOS transistor 211 is maintained in a turn-off state.

If a voltage on a wordline becomes a negative voltage, a leakage current $I_{leak}$ is generated at an NMOS transistor of a memory cell by gate induced drain leakage (GIDL). Due to the leakage current $I_{leak}$, the charges stored in the capacitor of the cell are discharged and refresh performance deteriorates.

The negative voltage generator 230 generates a first negative voltage VBB1 (i.e., VBB1 is a minus voltage with respect to ground) in a standby state. In a refresh operation, the negative voltage generator 230 generates a second negative voltage VBB2 that is lower with respect to ground than the first negative voltage VBB1. For example, VBB2=−0.2V and VBB1=−0.4V. The first or second negative voltage is supplied to a drain of an NMOS transistor N1 of the wordline driver 220. The second negative voltage VBB2 is supplied in the refresh operation so that the leakage current generated by GIDL can be reduced.

The negative voltage generator 230 includes a level detector 231, an oscillator 232, and a charge pump 233. The level detector 231 detects a first voltage level for generating the first negative voltage VBB1 in response to a standby signal STBY, and the level detector 231 detects a second voltage level for generating the second negative voltage VBB2 in response to a refresh signal SR. The oscillator 232 operates in response to a first or second voltage level for generating the second negative voltage VBB2 to generate complementary pulse signals. The charge pump 233 receives pulse signals generated by the oscillator 232 to generate a first negative voltage VBB1 or a second negative voltage VBB2.

Hereinafter a wordline voltage generator, according to an embodiment of the present invention, will be described. The wordline voltage generator includes the wordline driver 220 and the negative voltage generator 230. The wordline voltage generator supplies a first negative voltage to a wordline in a standby state and supplies a second negative voltage that is lower with respect to ground than the first negative voltage to the wordline in a refresh operation. The refresh operation is a self-refresh operation wherein an address is internally generated to continuously perform a refresh operation before an external refresh command is input. The wordline voltage generator supplies the first negative voltage by detecting a first voltage level in response to the standby signal and amplifying the first voltage level to generate the first negative voltage. The wordline voltage generator supplies the second negative voltage by detecting a second voltage level in response to the refresh signal and amplifying the second voltage level to generate the second negative voltage.

Figure 3:
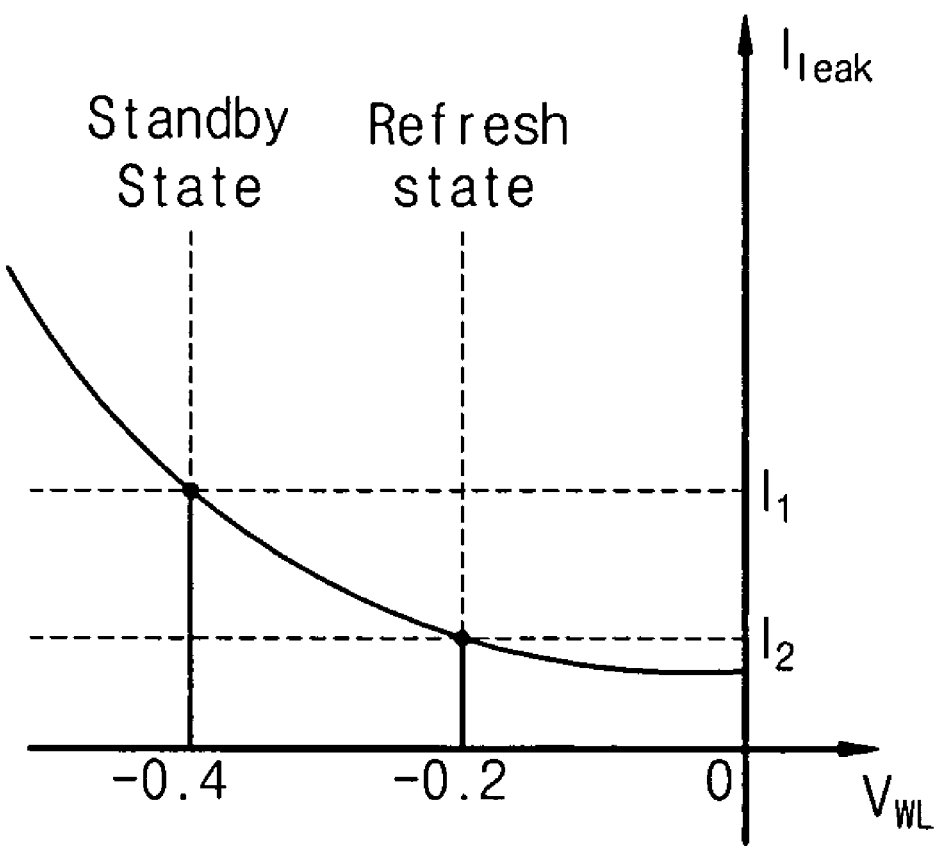
FIG. 3 is a graph showing characteristics of the semiconductor memory device illustrated in FIG. 2.

Hereinafter, characteristics of the semiconductor memory device according to embodiments of the present invention will be described with reference to the graph shown in FIG. 3. The graph illustrates the change in a leakage current $I_{leak}$ in relation to the change in a wordline voltage $V_{WL}$. As shown in FIG. 3, when a negative voltage (VBB1) of approximately −0.4V is applied to a wordline in a standby state, a leakage current generated by GIDL is "$I_1$". When a negative voltage (VBB2) of approximately −0.2V is applied to a wordline in a refresh state, a leakage current generated by GIDL is "$I_2$". In accordance with embodiments of the present invention, in a refresh operation, a leakage current can be reduced by "$I_1 − I_2$".

In the semiconductor memory device and method of supplying a wordline voltage thereof, according to embodiments of the present invention, a first negative voltage VBB1 is supplied to a wordline in a standby state, and a second negative voltage VBB2 that is lower with respect to ground than the first negative voltage VBB1 is supplied to a wordline in a refresh operation to reduce a leakage current generated by GIDL. Thus, the performance of a refresh operation is enhanced by the reduction of the leakage current generated at a transistor of a memory cell by GIDL.

Although processes and apparatus of the present invention have been described in detail with reference to the accompanying drawings for the purpose of illustration, it is to be understood that the inventive processes and apparatus are not to be construed as limited thereby. It will be readily apparent to those of reasonable skill in the art that various modifications to the foregoing exemplary embodiments may be made without departing from the scope of the invention as defined by the appended claims.

What is claimed is:

1. A semiconductor memory device comprising:
a memory cell connected to a wordline; and
a wordline voltage generator for supplying a first negative voltage to the wordline in a standby state and supplying a second negative voltage that is lower with respect to ground than the first negative voltage to the wordline in a refresh operation, wherein the wordline voltage generator does not supply a voltage to the bulk of a transistor of the memory cell.

2. The semiconductor memory device of claim 1, wherein the refresh operation is a self-refresh operation.

3. The semiconductor memory device of claim 1, wherein the wordline voltage generator comprises:
   a wordline driver for supplying the first or second negative voltage to the wordline when the wordline is deactivated; and
   a negative voltage generator for generating the first negative voltage in response to a standby signal and the second negative voltage in response to a refresh signal.

4. The semiconductor memory device of claim 3, wherein the wordline driver comprises:
   a PMOS transistor for supplying a voltage that is higher than a power supply voltage to the wordline when the wordline is activated; and
   an NMOS transistor for supplying the first or second negative voltage to the wordline when the wordline is deactivated.

5. The semiconductor memory device of claim 3, wherein the negative voltage generator comprises: a level detector for detecting a first voltage level for generating the first negative voltage in response to the standby signal and for detecting a second voltage level for generating the second negative voltage in response to the refresh signal.

6. The semiconductor memory device of claim 5, wherein the refresh operation is a self-refresh operation.

7. The semiconductor memory device of claim 1, wherein the memory cell includes one capacitor and the transistor is an MOS transistor.

8. A method for supplying a wordline voltage, comprising:
   supplying a first negative voltage to a wordline in response to a standby signal in a standby state; and
   supplying a second negative voltage that is lower with respect to ground than the first negative voltage to the wordline in response to a refresh signal when a semiconductor memory device enters a refresh state from the standby state,
   wherein the first negative voltage is about twice the second negative voltage.

9. The method of claim 8, wherein the refresh signal is a self-refresh signal.

10. The method of claim 8, wherein supplying a first negative voltage comprises:
    detecting a first voltage level in response to the standby signal; and
    amplifying the first voltage level to generate the first negative voltage.

11. The method of claim 8, wherein supplying a second negative voltage comprises:
    detecting a second voltage level in response to the refresh signal; and
    amplifying the second voltage level to generate the second negative voltage.

12. A semiconductor memory device comprising:
    a memory cell connected to a wordline; and
    a wordline voltage generator for supplying a first negative voltage to the wordline in response to the wordline being deactivated and the receipt of a standby signal and supplying a second negative voltage to the wordline in response to the wordline being deactivated and the receipt of a refresh signal; and
    a PMOS transistor for supplying a voltage that is higher than a power supply voltage to the wordline when the wordline is activated; and
    an NMOS transistor for supplying one of the first and second negative voltages to the wordline when the wordline is deactivated.

* * * * *